United States Patent [19]

Chen et al.

[11] Patent Number: 5,250,472
[45] Date of Patent: Oct. 5, 1993

[54] SPIN-ON-GLASS INTEGRATION PLANARIZATION HAVING SILOXANE PARTIAL ETCHBACK AND SILICATE PROCESSES

[75] Inventors: Kuang-Chao Chen; Shaw-Tzeng Hsia, both of Taipei, Taiwan

[73] Assignee: Industrial Technology Research Institute, Hsinchu, Taiwan

[21] Appl. No.: 941,161

[22] Filed: Sep. 3, 1992

[51] Int. Cl.⁵ .................................... H01L 21/465
[52] U.S. Cl. ................................ 437/231; 437/195;
  437/228; 437/235; 156/646; 156/653
[58] Field of Search ............... 437/231, 228, 195;
  357/54; 156/643, 646, 653, 656

[56] References Cited

U.S. PATENT DOCUMENTS

| | | | |
|---|---|---|---|
| 4,676,867 | 6/1987 | Elkins et al. | 156/643 |
| 4,775,550 | 10/1988 | Chu et al. | 437/228 |
| 4,826,786 | 5/1989 | Merenda | 437/195 |
| 4,885,262 | 12/1989 | Ting et al. | 437/231 |
| 5,003,062 | 3/1991 | Yen | 437/231 |
| 5,106,787 | 4/1992 | Yen | 437/231 |
| 5,119,164 | 6/1992 | Sliwa,Jr. et al. | 357/54 |

OTHER PUBLICATIONS

G. Hausamann et al., Proceedings 5th Intl IEEE VMIC Conf. 1988, pp. 293–298, The dependence of oxide and Spin-on-glass etchrates.

*Primary Examiner*—Olik Chaudhuri
*Assistant Examiner*—H. Jey Tsai
*Attorney, Agent, or Firm*—George O. Saile

[57] ABSTRACT

A new method of planarizing an integrated circuit is achieved. The dielectric layers between the conductive layers of an integrated circuit are formed and planarized via an integration of siloxane partial etchback and silicate processes. A first intermetal dielectric layer, thinner than that in conventional partial etchback methods, is deposited. This is covered with a siloxane spin-on-glass layer with no voids. This layer is baked, but not cured. The siloxane is partially etched back to the underlying metal layer resulting in a loss of planarity. An undoped silicate spin-in-glass coating is applied and baked followed by the curing of both the siloxane and silicate spin-on-glass layers. This results in excellent planarity with no cracking of the cured spin-on-glass. Most importantly, this method can be used for submicron technologies having conductor lines which are spaced from one another by submicron feature size.

12 Claims, 5 Drawing Sheets

SPIN-ON-GLASS INTEGRATION PLANARIZATION HAVING SILOXANE PARTIAL ETCHBACK AND SILICATE PROCESSES

BACKGROUND OF THE INVENTION (1) Field of the Invention

The invention relates to a method of planarizing an integrated circuit device, and more particularly, to a method of planarizing a submicron integrated circuit device by integrating a partial etchback siloxane process with a silicate process.

(2) Description of the Prior Art

In conventional planarization of the metallurgy-dielectric layers of an integrated circuit, a metal is deposited and patterned by conventional lithography and etching techniques. Then the dielectric layer, which is typically silicon oxide material, is formed thereover. The dielectric layer may now be etched back to planarize the metallurgy-dielectric layers. There are basic problems in the choice of thickness of the dielectric layer. The problems occur particularly where there are substantially different heights on the surfaces of the integrated circuit, particularly in the formation of memory word lines and the like in memory products. For example, in the areas where contact is planned to be made to the patterned metal, it is desired to have a thick dielectric layer to keep planarity, but the thick dielectric will cause voids in other areas. Alternatively, if a thin dielectric layer is used, there is lost planarity in the contact area and etchback encroachment of the metal pattern, but there will not be a void problem in other surface areas of the integrated circuit. There is not a good solution for this planarity versus void surface problem in the art.

The spin-on-glass materials have been used for planarization of integrated circuits. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is dirven off by a low temperature baking step often followed by vacuum degassing. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material.

In the conventional sandwich process, a conformal oxide is first deposited followed by a double coat of a phosphorus-doped silicate spin-on-glass material. This is cured at about 425° C. to become a phosphorus-doped silicon dioxide. The final oxide of the sandwich is deposited. This process can result in cracks and the planarity is poor. This process cannot be scaled down to the submicron level because there may be cracks in the small spaces and poor planarity in the wide spaces.

In the conventional etchback process, a siloxane spin-on-glass layer is etched back resulting in a poisoned via metallurgy, such as aluminum, caused by outgassing. When a via opening is made through the spin-on-glass, leaving a portion of the spin-on-glass exposed, there may be outgassing of water from the spin-on-glass layer. This water reacts with the aluminum causing corrosion of the aluminum. This method also cannot be scaled down to the submicron size because voids will occur where the first silicon oxide layer is very thick. If, however, the first silicon oxide layer is thin, planarity will be lost during etchback for the reasons described above.

A number of patents have addressed these and other problems in spin-on-glass planarization. U.S. Pat. No. 5,003,062 to Yen involves a sandwich process in which the spin-on-glass material can be either silicate or siloxane. A vacuum degassing step is used. In U.S. Pat. No. 4,775,550 to Chu et al, the first insulating layer is very thick, on the order of 8000 to 10,000 Angstroms. This thickness causes voids in the submicron area. The aforementioned patent to Chu et al as well as U.S. Pat. Nos. 4,676,867 to Elkins et al and 4,885,262 to Ting et al each show spin-on-glass etchback processes with use of a sandwich dielectric. Japanese publications 2-65256 (A), 63-302537 (A), 1-241135 (A), 2-1912 (A), 1-303741 (A), and 2-26054 (A) all show various processes for siloxane and silicate spin-on-glass.

SUMMARY OF THE INVENTION

A principal object of the present invention is to provide an effective and very manufacturable method of planarizing a submicron integrated circuit.

Another object of the present invention is to provide a method of planarizing an integrated circuit which does not result in cracks in the resulting intermetal dielectric.

Another object of the present invention is to provide a method of planarizing an integrated circuit which does not result in the metallurgy problem of poisoned via.

Yet another object of the present invention is to provide a method of planarizing an integrated circuit which does not result in voids between devices.

In accordance with the objects of this invention a new method of planarizing an integrated circuit is achieved. The dielectric layers between the conductive layers of an integrated circuit are formed and planarized via an integration of siloxane partial etchback and silicate processes. A first intermetal dielectric layer, thinner than that in conventional partial etchback methods, is deposited. This is covered with a siloxane spin-on-glass layer with no voids. This layer is baked, but not cured. The siloxane is partially etched back to the underlying metal layer resulting in a loss of planarity. An undoped silicate spin-in-glass coating is applied and baked followed by the curing of both the siloxane and silicate spin-on-glass layers. This results in excellent planarity with no cracking of the cured spin-on-glass. Most importantly, this method can be used for submicron technologies having conductor lines which are spaced from one another by submicron feature size.

BRIEF DESCRIPTION OF THE DRAWINGS

In the accompanying drawings forming a material part of this description, there is shown.

DESCRIPTION OF THE PREFERRED EMBODIMENTS

Figure 1:
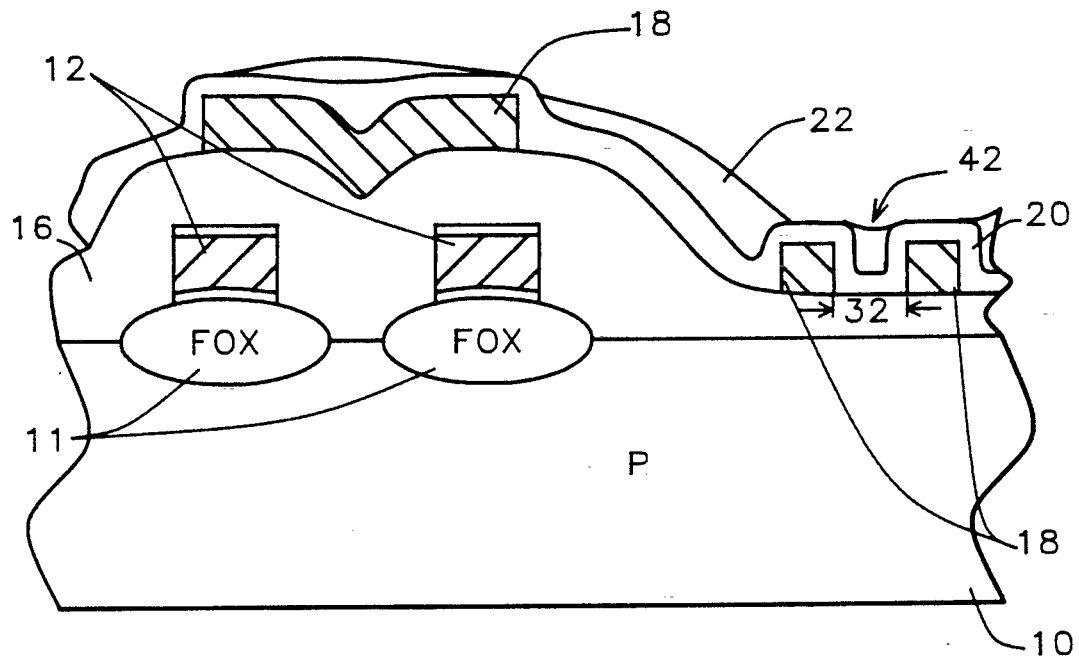
FIG. 1 schematically illustrates in cross-sectional representation a partially completed integrated circuit indicating the problems to be overcome by the present invention.

Referring now more particularly to FIG. 1, there is shown an illustration of a partially completed, integrated circuit. This figure will illustrate the problems that must be overcome when dealing with memory word lines and other features having feature sizes in the range of 0.8 microns, and in the future, less than 0.8 microns.

Field oxide regions 11 have been formed in the semiconductor substrate 10. Gate electrodes (not shown in FIG. 1, but are shown in other FIGS.) have been formed over the gate dielectric on the silicon substrate and conductive runner 12 have been formed overlying the FOX regions 11. A passivation layer 16 of silicon oxide and/or borophosphosilicate glass covers the devices in and on the substrate. Metal layer 18 has been deposited and etched to form the desired pattern. Layer 20 is the first insulator layer of the spin-on-glass sandwich, followed by the spin-on-glass layer 22.

The insulator layer 20 must be thicker than the spin-on-glass layer where the via holes are to be formed; otherwise, the etchback to metal layer 18 will result in loss of planarity. For the submicron field, if the insulator layer 20 is too thick, the space between features, 42, will be too small to be filled by the spin-on-glass material and will be left a void. Also, it is necessary to remove all of the spin-on-glass material from all open via areas so that outgassing does not occur. Normally, it is desired to have the first silicon oxide layer as thick as possible to provide greater planarity and, therefore, no voids. In the present invention, a thin first silicon oxide layer can be used because the spin-on-glass layer is deposited next and cured to give a thick, void-free silicon oxide layer. Thereafter, when etchback is used to planarize the first metal layer, the metal will not be etched into as it would be is a thin silicon oxide layer of the prior art had been used.

Figure 2:
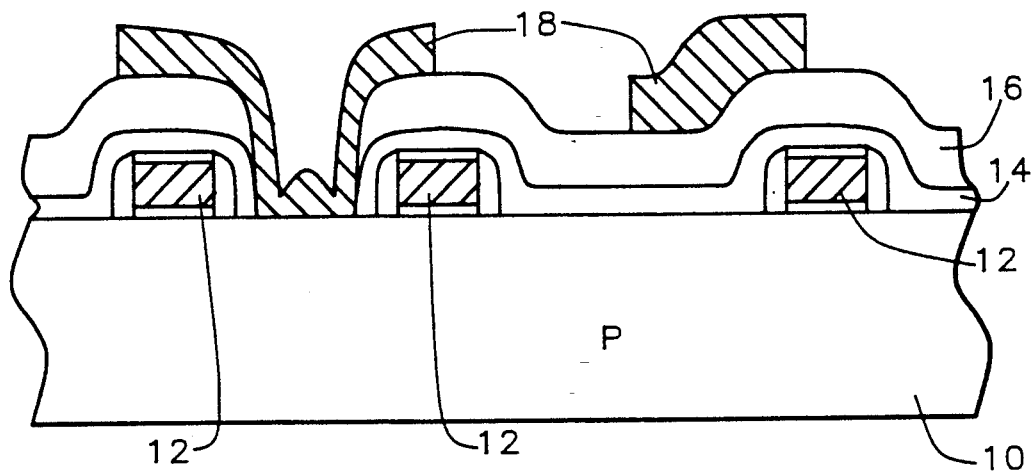
FIGS. 2, 3, 4, 5A, 5B, 6 and 7 schematically illustrate in cross-sectional representation one preferred embodiment of this invention.

Referring now to FIG. 2, there is shown a portion of a partially completed integrated circuit after patterning of the first metal layer 18. The semiconductor substrate 10 is preferably composed of monocrystalline silicon. Gate electrodes patterns 12 have been formed on the surface of the substrate 10 as is conventional in the art. A passivation or insulating layer is then formed over the surfaces of the patterns. This layer may be composed of multilayers such as a thin layer of silicon oxide 14 and a much thicker layer of borophosphosilicate glass, phosphosilicate glass or similar insulating layer 16. The operational thicknesses of these layers are between about 1000 to 3000 Angstroms for the oxide layer and between about 3000 to 5000 Angstroms for the glasseous layer. These layers are typically deposited by low pressure chemical vapor deposition (LPCVD) at a temperature of about 700° C.

Contact openings are formed through the insulating structure to the semiconductor substrate 10. Conventional lithography and etching techniques are used to form this pattern of openings.

The first metallurgy contact layer 18 is now deposited over the surface of the structure and within the pattern of via openings. The metallurgy is preferably Ti/TiW/AlSiCu having a thickness of between about 5000 to 6000 Angstroms. However, other possible metallurgy include Ti/TiN/AlSiCu, Ti/TiN/AlCu, Ti/TiW/AlCu, Ti/TiWN/AlSiCu, and Ti/TiWN/AlCu. The metallurgy may be deposited by a metal sputtering method. The metallurgy is now patterned into the desired conductive lines by conventional lithography and etching techniques to form the pattern of metal layer 18 in FIG. 2.

Figure 3:
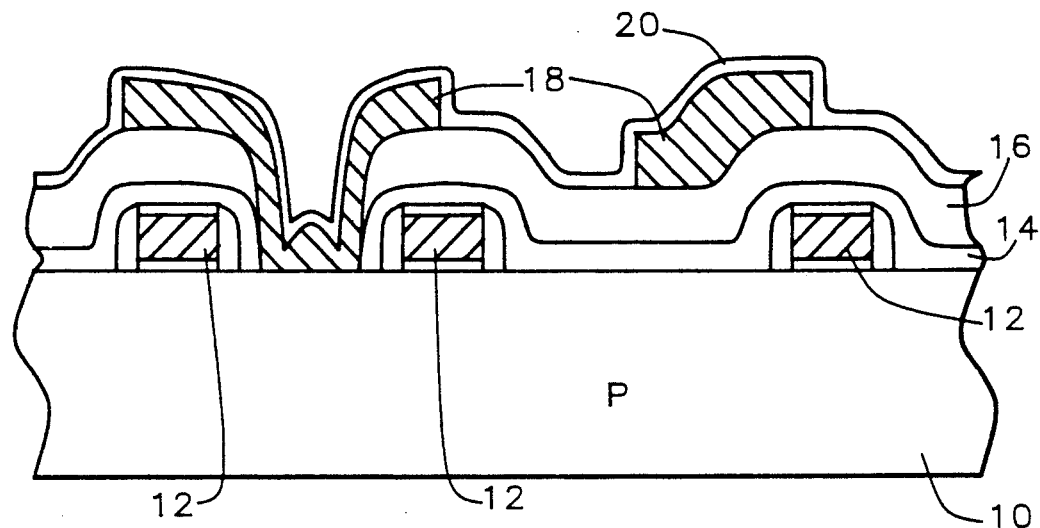

Referring now to FIG. 3, there is shown the conformal oxide deposition 20. This is the first dielectric layer of the spin-on-glass planarization structure. The thickness of this first insulator layer is critical for submicron technology. The sidewall thickness of the insulator layer is 0.6 times the surface thickness of the insulator. In calculating the thickness of the insulator, one must consider the feature size and the size of the opening left within the feature area after deposition of the insulator. The size of this opening will be equal to the feature size minus two times the sidewall thickness. If the opening is less than 0.3 microns in size, the subsequent spin-on-glass application will not fill the opening resulting in an unacceptable void.

TABLE 1

| Feature Size | Surface Thickness | Sidewall Thickness | Opening Size |
|---|---|---|---|
| 0.8 um | 5000A | 3000A | 0.2 um |
| 0.8 um | 3500A | 2100A | 0.38 um |
| 0.6 um | 1500A | 900A | 0.2 um |

As shown in Table 1 above, the opening size for a feature size of 0.8 microns and insulator thickness of 5000 Angstroms is too small and cannot be filled with the spin-on-glass material. The other two examples in the table have acceptable opening sizes.

Figure 4:
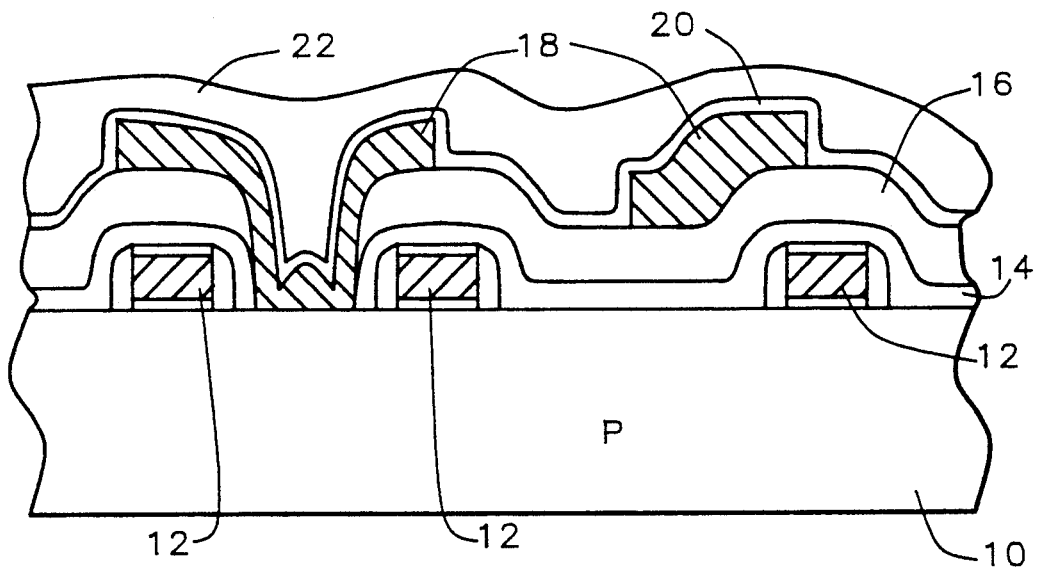

Referring now to FIG. 4, a siloxane spin-on-glass coating 22 is applied. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Note that there will be no voids unfilled by the spin-on-glass material because the first insulator layer thickness has been calculated as described above so that all spaces will be greater than or equal to 0.3 microns in size. There are a number of types of siloxane available. In the present invention, the preferred type is Methylsiloxane, such as is available from Allied Signal Corporation.

Figure 8:
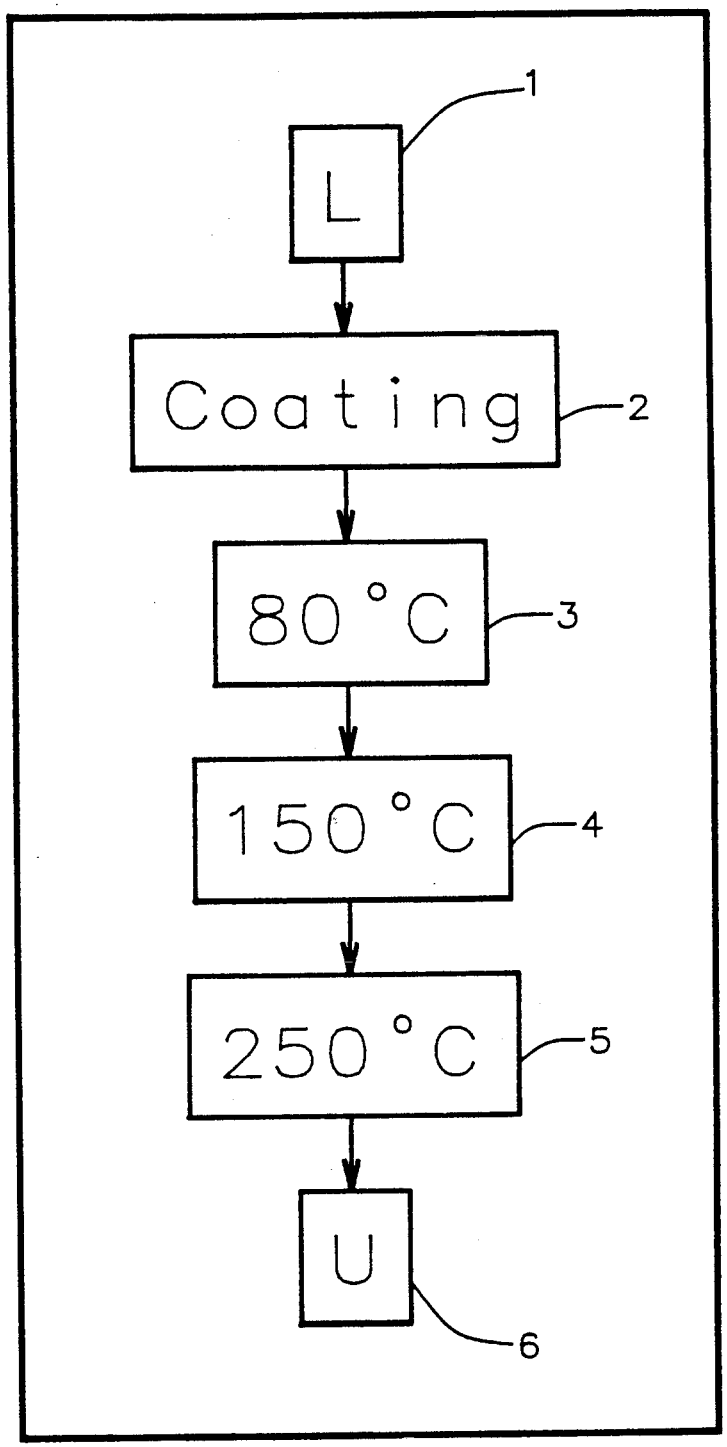
FIG. 8 schematically illustrates in cross-sectional representation a spin-on-glass coating apparatus.

Most of the vehicle or solvent is driven off by a low temperature baking step. The apparatus illustrated in FIG. 8 is used to coat and bake one wafer at a time. The wafer is loaded at the station point marked 1. It is moved to station 2 to be coated with the siloxane spin-on-glass material, then moved to stations 3, 4, and 5 were it is heated to for example 80° C., 150° C., and 250° C., respectively. Each heating duration is one to two minutes. A double coat of the spin-on-glass material may be applied. The total thickness of one or two coats of the siloxane is 3000 to 5000 Angstroms as measured on a bare wafer. A silicate spin-on-glass material is not used here to avoid the cracking problems of the prior art.

Figure 5A:
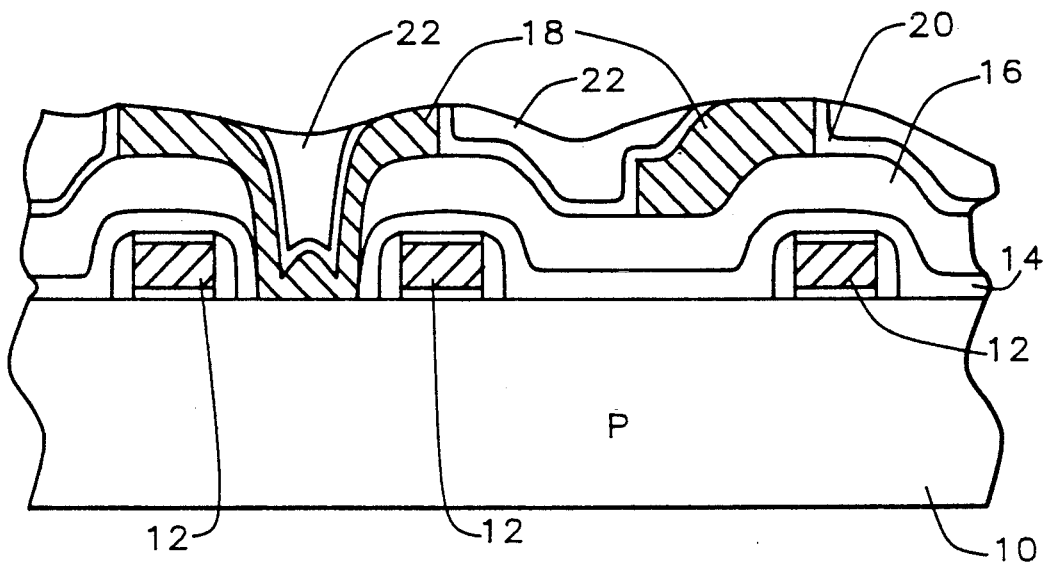

The spin-on-glass layer is not cured immediately, but is blanket anisotropically etched, as shown in FIG. 5A, through the silicon oxide layer 20 to the metal layer 18. This partial etchback is accomplished in an etchant machine PR5000 (Allied Material) where the gases used are $CHF_3$ at 75 sccm and $CF_4$ at 38 sccm, pressure is 150 mTorr, and power is 250 W and 100 Gauss. The etch is timed to stop based on thickness etched.

Figure 5B:
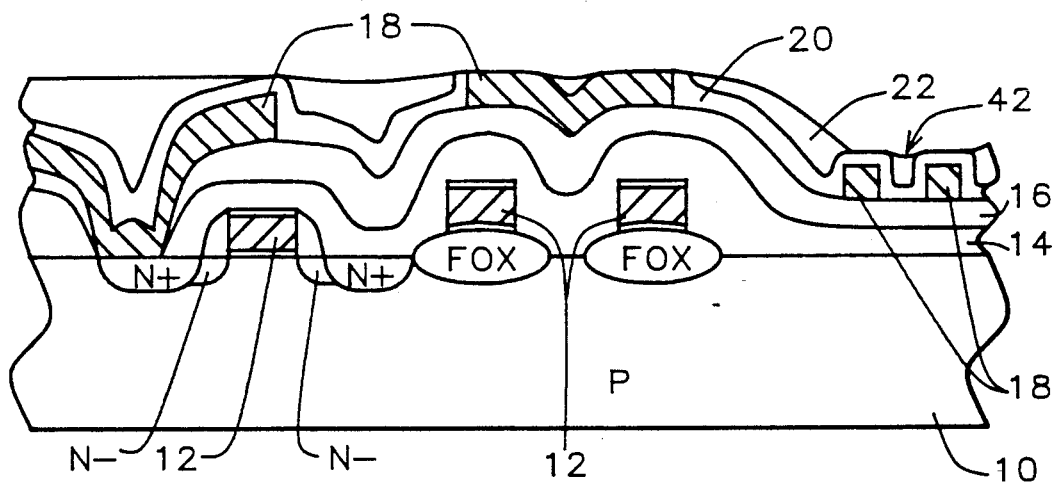

FIG. 5B illustrates a different area of the integrated circuit than seen in FIG. 5A. In FIG. 5B, which is similar to FIG. 1, it can be seen that the problem of a void 42 in FIG. 1 has been avoided. Opening 42 in FIG. 5B is large enough to be filled by the spin-on-glass layer 22.

Figure 6:
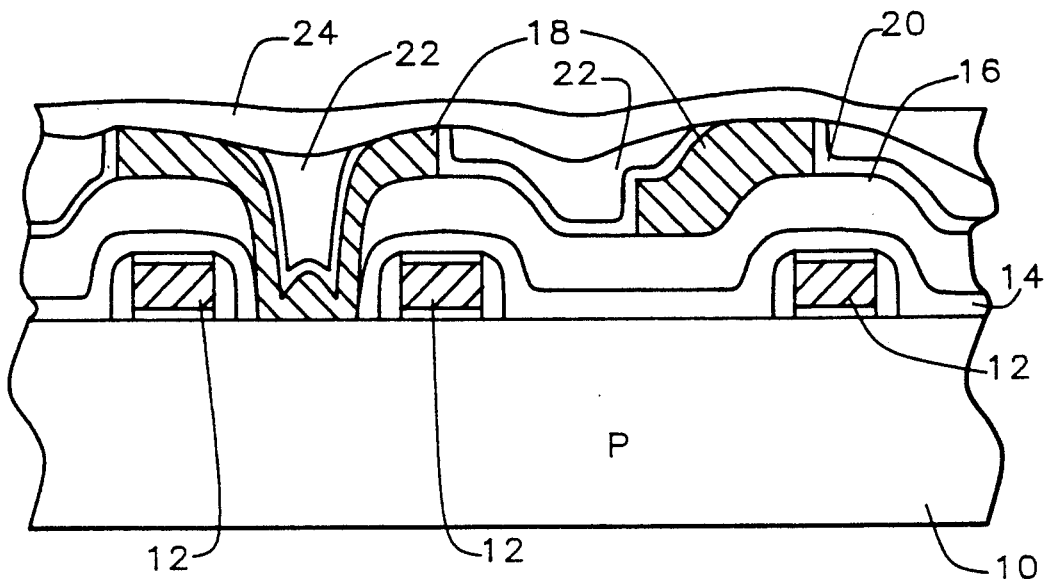

Continuing with the portion of the integrated circuit illustrated in FIG. 5A, refer now to FIG. 6. An undoped silicate spin-on-glass coating 24 is now applied over the siloxane coating 22. This coating has a thickness of between about 2000 to 4000 Angstroms. It is applied and baked in the same device used for siloxane spin-on-glass, illustrated in FIG. 8. Silicate, such as 103A and 203A, produced by Allied-Signal Corporation is preferred. P-doped silicate will absorb water from the environment causing corrosion of the metal; therefore, undoped silicate is preferred.

Now both siloxane and silicate spin-on-glass layers are cured for 1-1.5 hours at 425° C. The wafers to be cured enter the curing chamber which is at 375° C. in a nitrogen atmosphere. There is a 30 minute stabilization time followed by a 30 minute ramp-up from 375° C. to 425° C. The curing time is 60 to 90 minutes followed by a 30 minutes ramp-down to 375° C.

Figure 7:
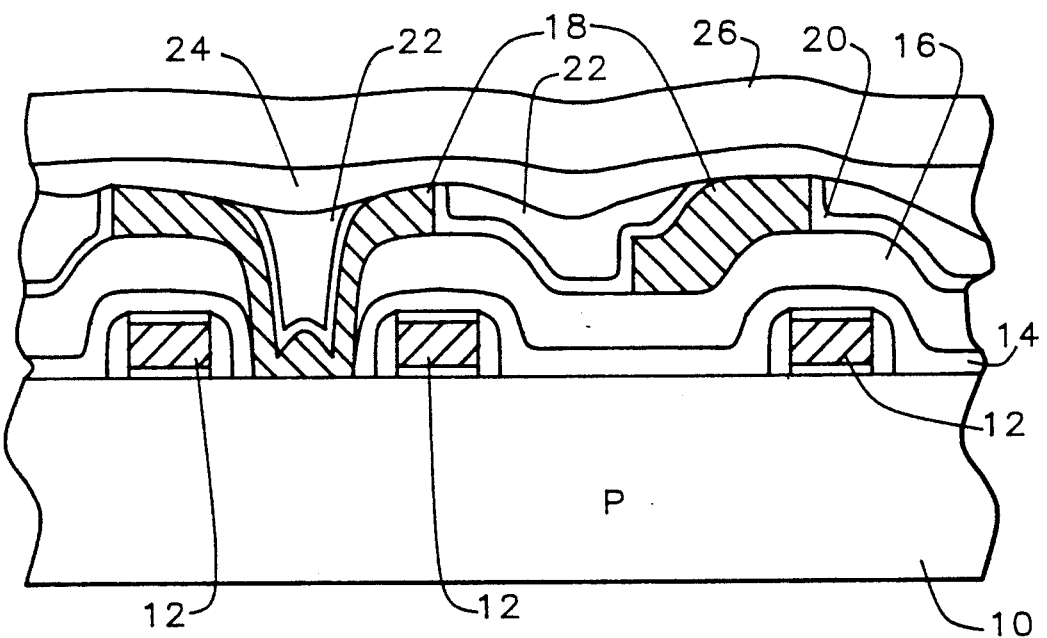

Finally, the top layer of the spin-on-glass sandwich is deposited. Layer 26 in FIG. 7, consisting of TEOS silicon oxide completes the planarization of the dielectric layer. The result of the method of the present invention is excellent planarity with no cracking of the cured spin-on-glass.

The following Examples in the Table are given to show the important features of the invention and to aid in the understanding thereof and variations may be made by one skilled in the art without departing from the spirit and scope of the invention.

The following table compares conventional sandwich and partial etchback processes to the integrated process of the present invention.

|  | Sandwich Process (Silicate SOG) | Partial Etchback (Siloxane SOG) | New Integrated Process |
| --- | --- | --- | --- |
| Poisoned Via | No | No | No |
| Curing Steps | 1 | 1 | 1 |
| Cracks | Yes | No | No |
| Planarity | Poor | Poor | Excellent |
| Process Steps | 4 | 5 | 6 |
| Submicron Process | No | No | Yes |

In conclusion, the silicate SOG sandwich is not acceptable because of cracks and poor planarity. The partial etchback siloxane SOG is not acceptable because of poor planarity. The integrated process of the present invention showed no cracks and has excellent planarity.

While the invention has been particularly shown and described with reference to the preferred embodiments thereof, it will be understood by those skilled in the art that various changes in form and details may be made without departing from the spirit and scope of the invention.

What is claimed is:

1. The method of planarizing the dielectric layers between conductor layers in submicron integrated circuits without the incorporation of voids and etch encroachment of a conductive layer comprising:

providing semiconductor device structures in and on a semiconductor substrate;

providing at least one patterned conductive layer for contacting the active elements of said device structures;

the surface of said patterned conductive layer structure is irregular with horizontal and vertical components;

providing a layer of an insulator over said irregular structure patterned conductive layer;

said insulator layer is deposited upon the said irregular structure with horizontal and vertical components and the sidewall thickness of said insulator layer covering said vertical components is equal to 0.6 times the surface thickness of said insulator layer on said horizontal components and furthermore, the space between adjoining insulator sidewalls wherein the size of said space equals the feature size minus two times said sidewall thickness must be greater than or equal to 0.3 microns so that said space can be filled by said siloxane spin-on-glass;

covering said insulator layer with at least one siloxane spin-on-glass layer to fill the valleys of said irregular structure and baking to drive off volatile components but not curing said siloxane spin-on-glass layer;

partially etching the thickness of said siloxane spin-on-glass layer and the said insulator layer at the top points of said conductive layer while leaving the said siloxane layer in said valleys and avoiding said etch encroachment of said conductive layer;

covering said partially etched back siloxane spin-on-glass layer with a silicate spin-on-glass layer and baking said silicate spin-on-glass layer to drive off volatile components;

curing both said siloxane and said silicate spin-on-glass layers; and depositing top dielectric layer over said silicate spin-on-glass layer to complete said planarization.

2. The method of claim 1 wherein there is one layer of said siloxane spin-on-glass which has a thickness of between about 3000 to 5000 Angstroms.

3. The method of claim 1 wherein there are two coatings of said siloxane spin-on-glass which have a combined thickness of between about 3000 to 5000 Angstroms.

4. The method of claim 1 wherein said partial etchback of said siloxane spin-on-glass layer has conditions: $CHF_3 = 75$ sccm, $CF_4 = 38$ sccm, Pressure = 150 mTorr, Power = 250 Watt and 100 Gauss.

5. The method of claim 1 wherein said silicate spin-on-glass has a thickness of between about 2000 to 4000 Angstroms.

6. The method of claim 1 wherein said siloxane and silicate spin-on-glass curing in a nitrogen atmosphere has conditions: boat in and stabilize at 375° C., then ramp up to 425° C. in 30 minutes and curing at 425° C. for 60-90 minutes, and finally, ramp down to 375° C. in 30 minutes and boat out.

7. The method of planarizing the surfaces of a submicron integrated circuit without the incorporation of voids and etch encroachment of a conductive layer comprising:

providing a thin insulator layer over said conductive layer which connects devices within said integrated circuit wherein there are substantial surface irregularities;

said thin insulator layer is deposited upon the said surface irregularities having vertical and horizontal components and the sidewall thickness of said insulator layer covering the vertical components is equal to 0.6 times the surface thickness of said insulator layer on the horizontal components and furthermore, the space between adjoining insulator sidewalls wherein the size of said space equals the feature size minus two times said sidewall thickness must be greater than or equal to 0.3 microns so that said space can be filled by said siloxane spin-on-glass;

covering said thin insulator layer with at least one siloxane spin-on-glass layer to fill the valleys of the said irregularities and baking but not curing said siloxane spin-on-glass layer;

partially blanket anisotropically etching said siloxane spin-on-glass layer through its thickness and the thickness of said insulator layer to underlying metal layer at its highest points and leaving the siloxane layer portions in said valleys;

covering said partially etched back siloxane spin-on-glass layer with a silicate spin-on-glass layer and baking said silicate spin-on-glass layer;

curing both said siloxane and said silicate spin-on-glass layers; and depositing top dielectric layer over said silicate spin-on-glass layer to complete said planarization.

8. The method of claim 7 wherein there is one layer of said siloxane spin-on-glass which has a thickness of between about 3000 to 5000 Angstroms.

9. The method of claim 7 wherein there are two coatings of said siloxane spin-on-glass which have a combined thickness of between about 3000 to 5000 Angstroms.

10. The method of claim 7 wherein said silicate spin-on-glass has a thickness of between about 2000 to 4000 Angstroms.

11. The method of claim 7 wherein said partial etchback of said siloxane spin-on-glass layer has conditions: $CHF_3 = 75$ sccm, $CF_4 = 38$ sccm, Pressure = 150 mTorr, Power = 250 Watt and 100 Gauss.

12. The method of claim 7 wherein said siloxane and silicate spin-on-glass curing in a nitrogen atmosphere has conditions: boat in and stabilize at 375° C., then ramp up to 425° C. in 30 minutes and curing at 425° C. for 60–90 minutes, and finally, ramp down to 375° C. in 30 minutes and boat out.

* * * * *